(12) United States Patent
Pehlke

(10) Patent No.: US 11,165,393 B2
(45) Date of Patent: Nov. 2, 2021

(54) ENVELOPE TRACKING FOR DOHERTY POWER AMPLIFIERS

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

(*) Notice: Subject to any disclaimer, the term of this patent is extended or adjusted under 35 U.S.C. 154(b) by 22 days.

(21) Appl. No.: 16/814,375

(22) Filed: Mar. 10, 2020

(65) Prior Publication Data

US 2020/0350866 A1 Nov. 5, 2020

Related U.S. Application Data

(60) Provisional application No. 62/823,099, filed on Mar. 25, 2019.

(51) Int. Cl.
| | |
|---|---|
| H03F 1/02 | (2006.01) |
| H04B 1/04 | (2006.01) |
| H03F 3/24 | (2006.01) |
| H04W 52/52 | (2009.01) |
| H04B 1/40 | (2015.01) |

(52) U.S. Cl.
CPC ........... *H03F 1/0288* (2013.01); *H03F 3/245* (2013.01); *H04B 1/40* (2013.01); *H04W 52/52* (2013.01); *H03F 2200/105* (2013.01); *H03F 2200/451* (2013.01)

(58) Field of Classification Search
CPC ..... H03F 1/02; H03F 1/30; H03F 1/32; H03F 3/193; H03F 3/24; H04B 1/04; H04B 1/40; H04B 2001/045; H04B 2001/0408
See application file for complete search history.

(56) References Cited

U.S. PATENT DOCUMENTS

| | | | |
|---|---|---|---|
| 6,356,149 B1 * | 3/2002 | Stengel | ................ H03F 1/0288 330/107 |
| 9,712,119 B2 | 7/2017 | Datta et al. | |
| 9,800,207 B2 | 10/2017 | Datta et al. | |
| 9,806,676 B2 | 10/2017 | Balteanu et al. | |
| 9,893,684 B2 | 2/2018 | Lehtola | |
| 9,912,298 B2 | 3/2018 | Lyalin et al. | |
| 9,979,349 B2 | 5/2018 | Lehtola | |
| 9,979,352 B2 * | 5/2018 | Hur | ........................ H03F 3/213 |
| 10,084,411 B2 | 9/2018 | Lehtola | |

(Continued)

*Primary Examiner* — Blane J Jackson
(74) *Attorney, Agent, or Firm* — Knobbe, Martens, Olson & Bear, LLP

(57) ABSTRACT

Envelope tracking schemes for Doherty power amplifiers are provided herein. In certain embodiments, a mobile device includes a Doherty power amplifier that amplifies an RF signal for transmission on an antenna, and an envelope tracker that controls a supply voltage of the Doherty power amplifier based on an envelope of the RF signal amplified by the Doherty power amplifier. Thus, supply modulation is used to control the supply voltage of the Doherty power amplifier to achieve gains in linearity, efficiency, and/or other performance metrics. Furthermore, the Doherty power amplifiers herein can provide higher overall transmission efficiency and/or lower DC power consumption, which in turn leads to lower operating temperatures and/or improved reliability.

20 Claims, 14 Drawing Sheets

(56) References Cited

U.S. PATENT DOCUMENTS

| | | |
|---|---|---|
| 10,110,184 B2 | 10/2018 | Lyalin et al. |
| 2015/0263678 A1* | 9/2015 | Kunihiro .............. H03F 1/42 330/295 |
| 2016/0241206 A1 | 8/2016 | Lehtola |
| 2016/0241207 A1 | 8/2016 | Lehtola |
| 2017/0310282 A1* | 10/2017 | Gepstein .............. H03F 1/0205 |
| 2017/0338773 A1 | 11/2017 | Balteanu et al. |
| 2018/0138862 A1 | 5/2018 | Balteanu et al. |
| 2018/0145636 A1 | 5/2018 | Datta et al. |
| 2018/0159478 A1 | 6/2018 | Balteanu et al. |
| 2018/0167042 A1* | 6/2018 | Nagasaku ............ H03F 1/3205 |
| 2018/0198424 A1 | 7/2018 | Sharma et al. |
| 2018/0241360 A1 | 8/2018 | Lehtola |
| 2018/0262162 A1 | 9/2018 | Lyalin et al. |
| 2018/0323758 A1 | 11/2018 | Lyalin et al. |
| 2018/0351454 A1 | 12/2018 | Khesbak et al. |
| 2019/0097582 A1 | 3/2019 | Lehtola |
| 2019/0123690 A1 | 4/2019 | Balteanu et al. |
| 2019/0140591 A1 | 5/2019 | Lehtola |
| 2019/0149099 A1 | 5/2019 | Lehtola |
| 2019/0158046 A1 | 5/2019 | Lehtola et al. |
| 2019/0181892 A1* | 6/2019 | Takenaka ............ H04W 52/362 |
| 2019/0214945 A1 | 7/2019 | Lehtola |
| 2019/0326864 A1 | 10/2019 | Lehtola |
| 2019/0334481 A1 | 10/2019 | Lyalin et al. |
| 2019/0363684 A1 | 11/2019 | Sharma et al. |
| 2019/0372526 A1 | 12/2019 | Balteanu et al. |
| 2019/0386617 A1 | 12/2019 | Naraine et al. |
| 2020/0014338 A1 | 1/2020 | Datta et al. |
| 2020/0028472 A1* | 1/2020 | Scott ................ H03F 3/19 |
| 2020/0067406 A1 | 2/2020 | Khesbak et al. |
| 2020/0091879 A1 | 3/2020 | Lyalin et al. |
| 2020/0162028 A1 | 5/2020 | Balteanu et al. |
| 2020/0259459 A1 | 8/2020 | Balteanu et al. |
| 2020/0350866 A1 | 11/2020 | Pehlke |
| 2021/0083627 A1* | 3/2021 | Sakata ................ H03F 3/217 |

* cited by examiner

ENVELOPE TRACKING FOR DOHERTY POWER AMPLIFIERS

CROSS-REFERENCE TO RELATED APPLICATIONS

This application claims the benefit of priority under 35 U.S.C. § 119 of U.S. Provisional Patent Application No. 62/823,099, filed Mar. 25, 2019 and titled "ENVELOPE TRACKING FOR DOHERTY POWER AMPLIFIERS," which is herein incorporated by reference in its entirety.

BACKGROUND

Field

Embodiments of the invention relate to electronic systems, and in particular, to radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications in Frequency Range 1 (FR1).

SUMMARY

In certain embodiments, the present disclosure relates to a mobile device. The mobile device includes a transceiver configured to generate a first radio frequency signal, a front end system including a Doherty power amplifier configured to amplify the first radio frequency signal, and a power management system including an envelope tracker configured to control at least one supply voltage of the Doherty power amplifier based on a first envelope signal indicating an envelope of the first radio frequency signal.

In various embodiments, the Doherty power amplifier includes a carrier amplification stage and a peaking amplification stage, and the at least one supply voltage includes a common supply voltage to the carrier amplification stage and the peaking amplification stage.

In some embodiments, the Doherty power amplifier includes a carrier amplification stage and a peaking amplification stage, and the at least one supply voltage includes a first supply voltage to the carrier amplification stage and a second supply voltage to the peaking amplification stage. According to a number of embodiments, the Doherty power amplifier further includes a delay circuit configured to delay the first supply voltage to generate the second supply voltage. In accordance with several embodiments, the delay circuit is operable to compensate for a phase delay mismatch between the carrier amplification stage and the peaking amplification stage. According to various embodiments, the envelope tracker includes a first envelope tracking circuit configured to generate the first supply voltage based on the first envelope signal and a second envelope tracking circuit configured to generate the second supply voltage based on a second envelope signal. In accordance with a number of embodiments, the transceiver generates the first envelope signal and the second envelope signal.

In several embodiments, the Doherty power amplifier includes a carrier amplification stage configured to receive the first radio frequency signal from the transceiver and a peaking amplification stage configured to receive a second radio frequency signal from the transceiver.

In various embodiments, the Doherty power amplifier includes a carrier amplification stage configured to receive the first radio frequency signal, an input phase shifter configured to generate a second radio frequency signal based on phase shifting the first radio frequency signal, and a peaking amplification stage configured to receive the second radio frequency signal. According to a number of embodiments, the phase shift provided by the input phase shifter is about ninety degrees.

In some embodiments, the transceiver generates the first envelope signal.

In various embodiments, the mobile device further includes an antenna configured to wirelessly transmit an amplified radio frequency signal from the Doherty power amplifier.

In certain embodiments, the present disclosure relates to a method of radio frequency amplification. The method includes amplifying a radio frequency signal to generate an amplified radio frequency signal using a Doherty power amplifier, and controlling at least one supply voltage of the Doherty power amplifier based on an envelope signal using an envelope tracker, the envelope signal indicating an envelope of the radio frequency signal.

In various embodiments, controlling the at least one supply voltage of the Doherty power amplifier includes powering a carrier amplification stage and a peaking amplification stage with a common supply voltage.

In several embodiments, controlling the at least one supply voltage of the Doherty power amplifier includes powering a carrier amplification stage with a first supply voltage and powering a peaking amplification stage with a second supply voltage. According to some embodiments, the at least one supply voltage of the Doherty power amplifier further includes delaying the first supply voltage to generate the second supply voltage. In accordance with a number of embodiments, the method further includes controlling a delay of the delay circuit to compensate for a phase delay mismatch between the carrier amplification stage and the peaking amplification stage. According to some embodiments, controlling the at least one supply voltage of the Doherty power amplifier further includes generating the first supply voltage and the second supply voltage based on different envelope signals.

In various embodiments, the method further includes providing the radio frequency signal from a transceiver to a carrier amplification stage of the Doherty power amplifier, and providing a separate radio frequency signal from the transceiver to a peaking amplification stage of the Doherty power amplifier.

In several embodiments, the method further includes providing the radio frequency signal to a carrier amplification stage of the Doherty power amplifier, delaying the radio frequency signal to generate a delayed radio frequency signal, and providing the delayed radio frequency signal to a peaking amplification stage of the Doherty power amplifier.

In some embodiments, the method further includes generating the envelope signal ad the radio frequency signal using a transceiver.

In various embodiments, the method further includes transmitting the amplified radio frequency signal using an antenna.

In certain embodiments, the present disclosure relates to an envelope tracking system. The envelope tracking system includes a Doherty power amplifier configured to amplify a radio frequency signal to generate an amplified radio frequency signal, and an envelope tracker configured to control at least one supply voltage of the Doherty power amplifier based on an envelope signal indicating an envelope of the radio frequency signal.

In various embodiments, the Doherty power amplifier includes a carrier amplification stage and a peaking amplification stage, and the at least one supply voltage includes a common supply voltage to the carrier amplification stage and the peaking amplification stage.

In several embodiments, the Doherty power amplifier includes a carrier amplification stage and a peaking amplification stage, and the at least one supply voltage includes a first supply voltage to the carrier amplification stage and a second supply voltage to the peaking amplification stage. According to a number of embodiments, the Doherty power amplifier further includes a delay circuit configured to delay the first supply voltage to generate the second supply voltage. In accordance with some embodiments, the delay circuit is operable to compensate for a phase delay mismatch between the carrier amplification stage and the peaking amplification stage. According to various embodiments, the envelope tracker includes a first envelope tracking circuit configured to generate the first supply voltage and a second envelope tracking circuit configured to generate the second supply voltage, and the first and second envelope tracking circuits are configured to process different envelope signals.

In some embodiments, the Doherty power amplifier includes a carrier amplification stage configured to receive a first radio frequency input signal from a transceiver and a peaking amplification stage configured to receive a second radio frequency input signal from the transceiver.

In several embodiments, the Doherty power amplifier includes a carrier amplification stage configured to receive the radio frequency signal, an input phase shifter configured to generate a delayed radio frequency signal based on phase shifting the radio frequency signal, and a peaking amplification stage configured to receive the delayed radio frequency signal. According to a number of embodiments, the phase shift provided by the input phase shifter is about ninety degrees.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
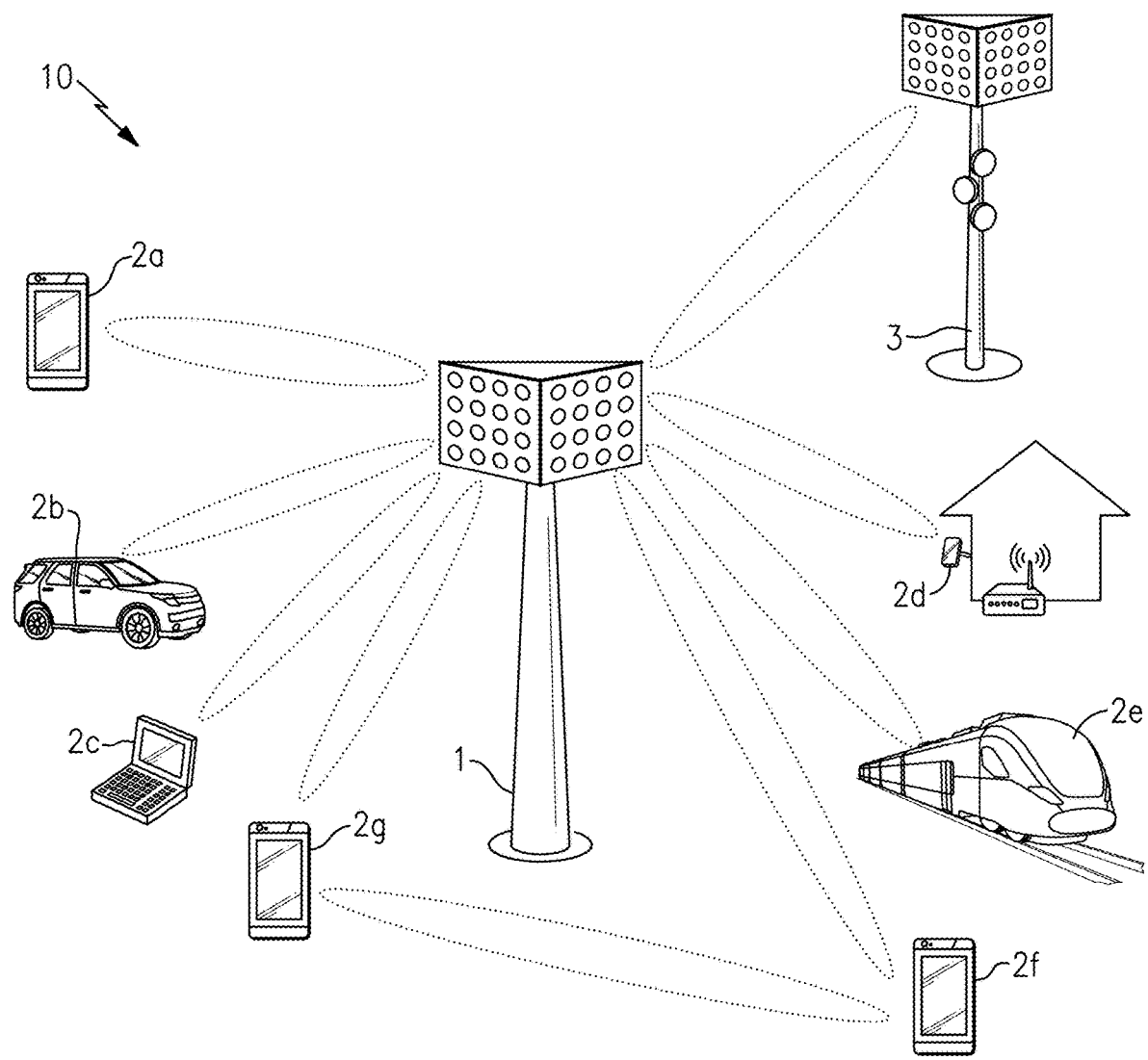
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Examples of Envelope Tracking for Doherty Power Amplifiers

Certain wireless communication systems, such as 5G systems, operate with relatively high data rate, relatively large capacity, and/or relatively low latency. Such systems include power amplifiers for amplifying RF signals for transmission on antennas, for instance, on antenna elements of an antenna array. To enhance performance of such systems, it is desirable for the power amplifiers to operate with high efficiency (for instance, low DC power consumption) and/or to operate with good linearity.

One type of power amplifier is a Doherty power amplifier, which includes a main or carrier amplification stage and an auxiliary or peaking amplification stage that operate in combination with one another to amplify an RF signal. The Doherty power amplifier combines a carrier signal component from the carrier amplification stage and a peaking signal component from the peaking stage to generate an amplified RF output signal. In certain implementations, the carrier amplification stage is enabled over a wide range of power levels while the peaking amplification stage is selectively enabled (for instance, by a class C bias circuit) at high power levels.

Conventional Doherty power amplifiers operate with a fixed supply voltage to power the carrier amplification stage and the peaking amplification stage. Such Doherty power amplifiers operate with high efficiency at 6 dB power back-off, but suffer from inefficiencies at lower power levels, for very high peak-to-average ratio (PAPR) waveforms, and/or when the output power is not well-centered at the peak of the amplifier's power-dependent efficiency profile.

Envelope tracking schemes for Doherty power amplifiers are provided herein. In certain embodiments, a communication system includes a Doherty power amplifier that amplifies an RF signal for transmission on an antenna, and an envelope tracker that controls a supply voltage of the Doherty power amplifier based on an envelope of the RF signal amplified by the Doherty power amplifier.

Thus, supply modulation is used to control the supply voltage of the Doherty power amplifier. Implementing the communication system in this manner achieve gains in linearity, efficiency, and/or other performance metrics. Furthermore, the Doherty power amplifiers herein can provide higher overall transmission efficiency and/or lower DC power consumption, which in turn leads to lower operating temperatures and/or improved reliability.

A Doherty power amplifier includes a carrier amplification stage in a carrier branch, and a peaking amplification stage in a peaking branch. During operation of the Doherty power amplifier, the carrier branch and the peaking branch can operate at different levels of compression and/or linearity. For instance, in certain implementations, the RF input signals processed by the carrier branch and the peaking branch have a phase offset of about ninety degrees, which leads to the branches operating with a timing mismatch.

In certain implementations, the communication system is implemented to compensate for differences in compression and/or linearity between the carrier branch and the peaking branch.

In a first example, a delay circuit is used to delay the supply voltage to the peaking amplification stage relative to the carrier amplification stage. For instance, a controllable delay-line can be used to match the delay of the supply voltage to a corresponding delay arising from the phase difference between the RF input signal processed by the carrier branch and the RF input signal processed by the peaking branch.

In a second example, the envelope tracker is implemented with a first envelope tracking circuit for controlling the supply voltage of the carrier amplification stage based on a first envelope signal, and a second envelope tracking circuit for controlling the supply voltage of the peaking amplification stage based on a second envelope signal. Accordingly, the supply voltages of the carrier and peaking branches can be separately controlled to compensate for timing differences in the operation of the branches.

In a third example, the phases of the RF input signals to the carrier and peaking branches are separately controlled (for instance, using digital control from baseband), thereby providing a mechanism for controlling relative phase alignment between the carrier branch and the peaking branch.

Implementing the communication system to provide compensation for the branches of a Doherty power amplifier operating at different levels of compression and/or linearity can provide a number of advantages. For instance, enhanced linearity and/or signal quality in the RF output signal generated by the Doherty power amplifier can be achieved.

In other implementations, a common supply voltage is used to power the carrier branch and the peaking branch. For example, such an approach can be suitable for applications with relatively low bandwidth and/or in which a degradation in the reconstructed RF output signal can be tolerated.

The teachings herein are applicable to a wide variety of RF communication systems, including, but not limited to, base stations, network access points, mobile phones, tablets, customer-premises equipment (CPE), laptops, computers, wearable electronics, and/or other communication devices.

Figure 2:
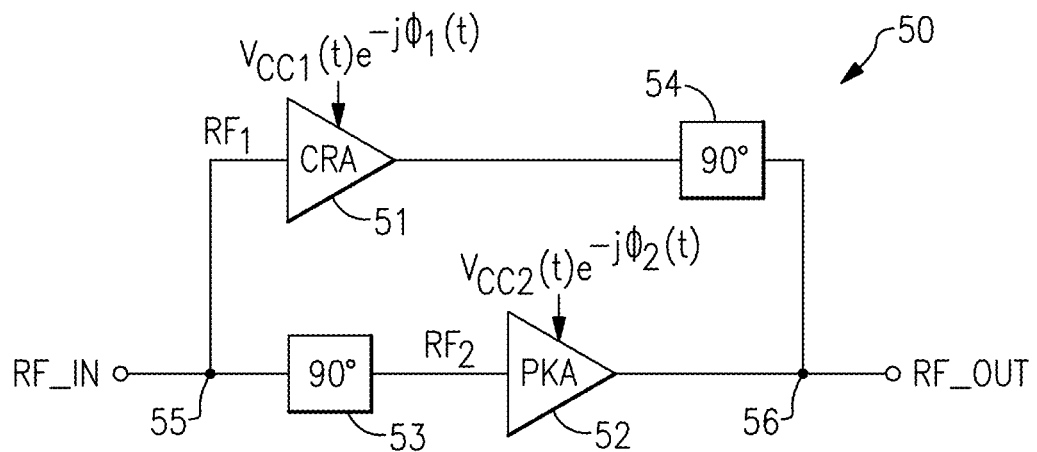
FIG. 2 is a schematic diagram of a Doherty power amplifier according to one embodiment.

FIG. 2 is a schematic diagram of a Doherty power amplifier 50 according to one embodiment. The Doherty power amplifier 50 includes a carrier amplification stage 51, a peaking amplification stage 52, an input phase shifter 53, and an output phase shifter 54.

Although one embodiment of a Doherty power amplifier is shown, the teachings herein are applicable to Doherty power amplifiers implemented in a wide variety of ways.

As shown in FIG. 2, the Doherty power amplifier 50 splits an RF signal received at the input terminal RF_IN to generate a first RF input signal $RF_1$ for the carrier amplification stage 51 and a replica of the first RF input signal, which is phase-shifted by the phase shifter 53 (by about ninety degrees, in this example) to generate the second RF input signal $RF_2$. However, other implementations are possible. For instance, a 3 dB or hybrid coupler can be used to split the RF signal into a pair of signals having a phase difference of about ninety degrees.

The carrier amplification stage 51 amplifies the first RF input signal $RF_1$ to generate a first amplified RF signal, while the peaking amplification stage 52 amplifies the second RF input signal $RF_2$ to generate a second amplified RF signal. The first amplified RF signal is phased-shifted by the output phase shifter 54 (by about ninety degrees, in this example), and thereafter combined with the second amplified RF signal at the node 56 to generate an RF output signal for the output terminal RF_OUT. However, other implementations are possible. For instance, a 3 dB or hybrid coupler can be used to combine the first amplified RF signal and the second amplified RF signal.

In the illustrated embodiment, the carrier amplification stage 51 operates with a first modulated supply voltage expressed by the equation $V_{CC1}(t)e^{-j\varphi_1(t)}$. Additionally, the peaking amplification stage 52 operates with a second modulated supply voltage expressed by the equation $V_{CC2}(t)e^{-j\varphi_2(t)}$. Thus, the carrier amplification stage 51 and the peaking amplification stage 52 operate with separately controllable supply voltages that can have different time dependencies.

The expressions $RF_1 * V_{CC1}(t)e^{-j\varphi_1(t)}$ and $RF_2 * V_{CC2}(t)e^{-j\varphi_2(t)}$ can be used to quantify the amplitude/phase delay alignment of the Doherty power amplifier 50. However, other representations of amplitude/phase delay alignment are possible.

Figure 3:
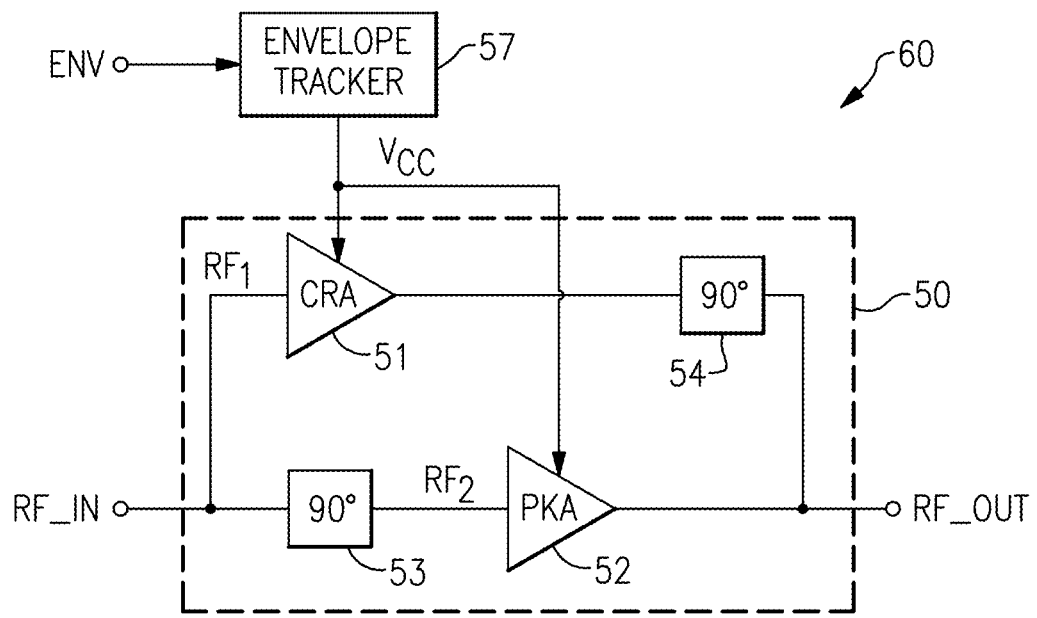
FIG. 3 is a schematic diagram of one embodiment of an envelope tracking system for a Doherty power amplifier.

FIG. 3 is a schematic diagram of one embodiment of an envelope tracking system 60 for a Doherty power amplifier 50.

Although one embodiment of an envelope tracking system is shown, the teachings herein are applicable to envelope tracking systems implemented in a wide variety of ways.

In the illustrated embodiment, the envelope tracking system 60 includes an envelope tracker 57 that receives an envelope signal ENV that changes in relation to the envelope of the RF signal amplified by the Doherty power amplifier 50. Additionally, the envelope tracker 57 generates the supply voltage $V_{CC}$ based on the envelope signal ENV, and powers both the carrier amplification stage 51 and the peaking amplification stage 52 of the Doherty power amplifier 50 with the supply voltage $V_{CC}$. Thus, supply modulation to both branches is performed concurrently, in this example.

Implementing the envelope tracking system in this manner can reduce cost, component count, and/or complexity. However, implementing the envelope tracking system in this manner can introduce a timing mismatch that may degrade the quality of the RF output signal generated by combining the waveforms from the carrier and peaking branches. For instance, the reconstructed signal linearity can be degraded based on the amount of timing mismatch and the modulation bandwidth.

Using a common supply voltage for the carrier and peaking breaches can be suitable for applications with relatively low bandwidth and/or in which a degradation in the reconstructed RF output signal can be tolerated. For wider bandwidth, the tolerance for timing mismatch is significantly reduced. For example, ninety degrees of phase at 1 GHz corresponds to about 250 ps, while 90 degrees at 2 GHz and 4 GHz corresponds to about 125 ps and about 62.5 ps, respectively. Accordingly, tolerance can be less at higher RF frequencies.

Thus, the timing mismatch may be manageable for low bandwidth and/or lower frequency applications, but may be unacceptable for high bandwidth and/or high frequency applications. For instance, a timing mismatch of less than 1 ns may be desired for 20 MHz envelope tracking bandwidth, while a timing mismatch on the order of tens of picoseconds may be desired for 100 MHz envelope tracking bandwidth.

Figure 4:
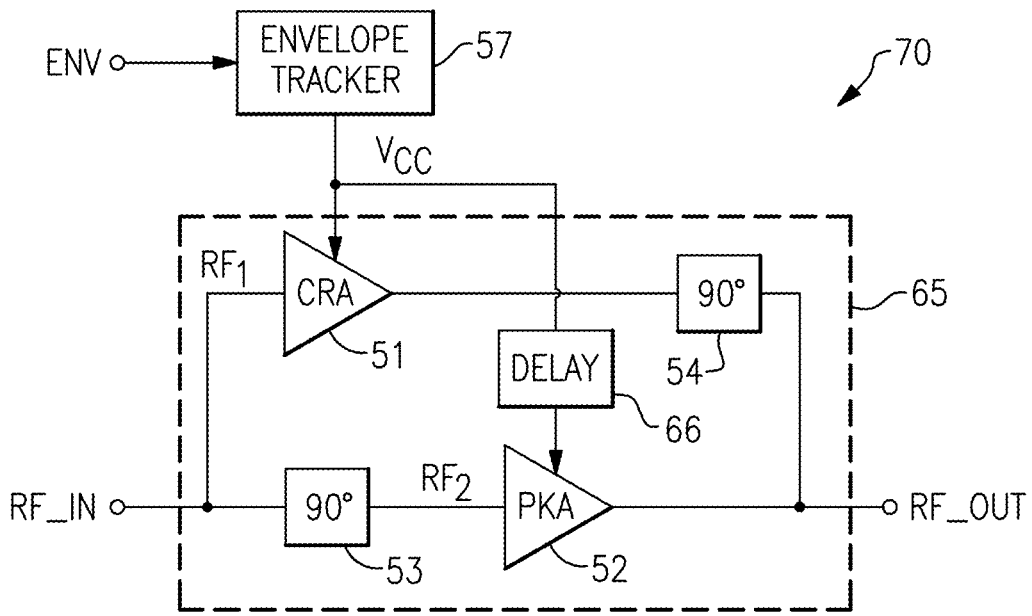
FIG. 4 is a schematic diagram of another embodiment of an envelope tracking system for a Doherty power amplifier.

FIG. 4 is a schematic diagram of another embodiment of an envelope tracking system 70 for a Doherty power amplifier 65.

The envelope tracking system 70 of FIG. 4 is similar to the envelope tracking system 60 of FIG. 3, except that the Doherty power amplifier 65 of FIG. 4 further includes a delay circuit 66 for controlling a delay of the supply voltage $V_{CC}$ to the peaking amplification stage 52. Thus, a relative delay between the supply voltage to the peaking amplification stage 52 and the supply voltage to the carrier amplification stage 51 can be controlled.

In certain implementations, the delay circuit 66 includes a controllable delay-line used to match the delay of the supply voltage to a corresponding delay arising from the phase difference between the first RF input signal $RF_1$ and the second RF input signal $RF_2$.

Thus, broadband match of the relative phase and timing can be maintained to aid in reconstructing the RF output signal from the waveforms provided by the carrier and peaking branches.

Figure 5:
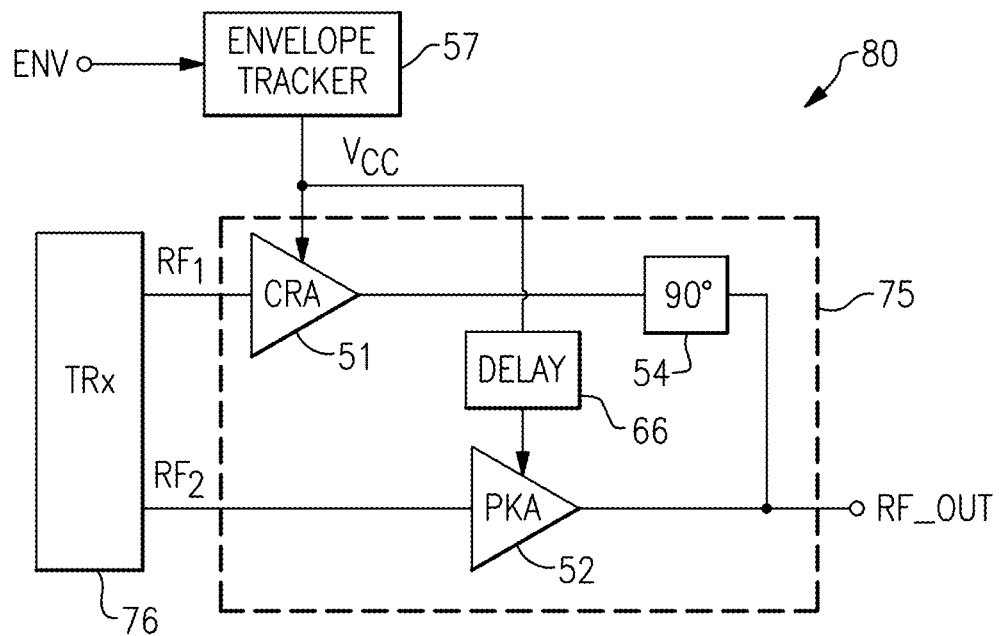
FIG. 5 is a schematic diagram of another embodiment of an envelope tracking system for a Doherty power amplifier.

FIG. 5 is a schematic diagram of another embodiment of an envelope tracking system 80 for a Doherty power amplifier 75.

In comparison to the Doherty power amplifier 65 of FIG. 4, the Doherty power amplifier 75 of FIG. 5 omits the input phase shifter 53 in favor of receiving the first RF input signal $RF_1$ and the second RF input signal $RF_2$ as separately controllable inputs from a transceiver 76.

Implementing the envelope tracking system 80 in this manner provides a mechanism for controlling relative phase alignment between the carrier branch and the peaking branch of the Doherty power amplifier 75. For example, the phase of the first RF input signal $RF_1$ to the carrier amplification stage 51 and the phase of the second RF input signal $RF_2$ to the peaking amplification stage 52 are separately controllable.

In certain implementations, the first RF input signal $RF_1$ is generated from a first pair of I and Q baseband signals and the second RF input signal $RF_2$ is generated from a second pair of I and Q baseband signals. For example, a baseband processor can output separate pairs of I and Q baseband signals for modulation by separate I/Q modulators. In another implementation, a common pair of I and Q baseband signals are modulated by separate I/Q modulators, but a digitally-controlled delay circuit controls a delay between providing the I and Q baseband signals to one I/Q modulator relative to the other I/Q modulator.

Thus, RF drive signals to carrier and peaking branches of a Doherty power amplifier can be digitally driven directly from the transceiver. This in turn provides a number of advantages, such as enhanced bandwidth and/or flexibility in controlling digital pre-distortion (DPD) for efficiency, linearity and/or noise advantages.

Figure 6:
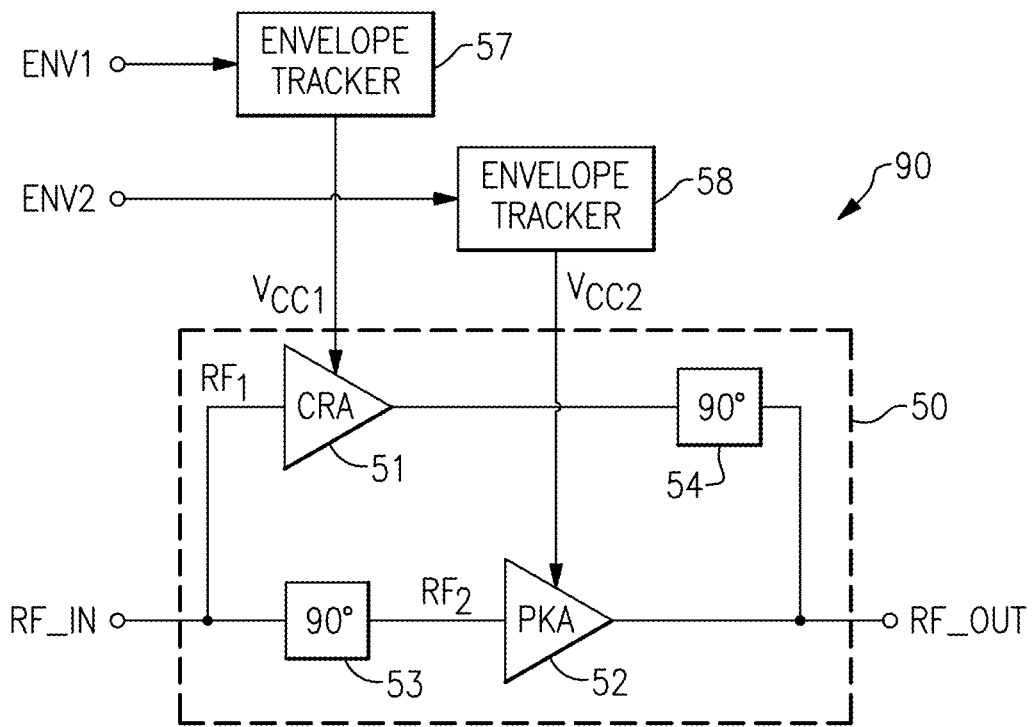
FIG. 6 is a schematic diagram of another embodiment of an envelope tracking system for a Doherty power amplifier.

FIG. 6 is a schematic diagram of another embodiment of an envelope tracking system 90 for a Doherty power amplifier 50.

The envelope tracking system 90 of FIG. 6 includes a first envelope tracker 57 for processing a first envelope signal ENV1 to generate a first supply voltage $V_{CC1}$ of the carrier amplification stage 51, and a second envelope tracker 58 for processing a second envelope signal ENV2 to generate a second supply voltage $V_{CC2}$ of the peaking amplification stage 52.

Thus, in comparison to the envelope tracking system 60 of FIG. 3 that uses a common envelope tracker to control a common supply voltage to both branches of the Doherty power amplifier 50, the envelope tracking system 90 of FIG. 6 uses multiple envelope trackers to generate separately controllable supply voltages.

Implementing the envelope tracking system 90 in this manner provides a number of advantages, such as enhanced adjustability for amplitude/phase delay alignment.

Figure 7:
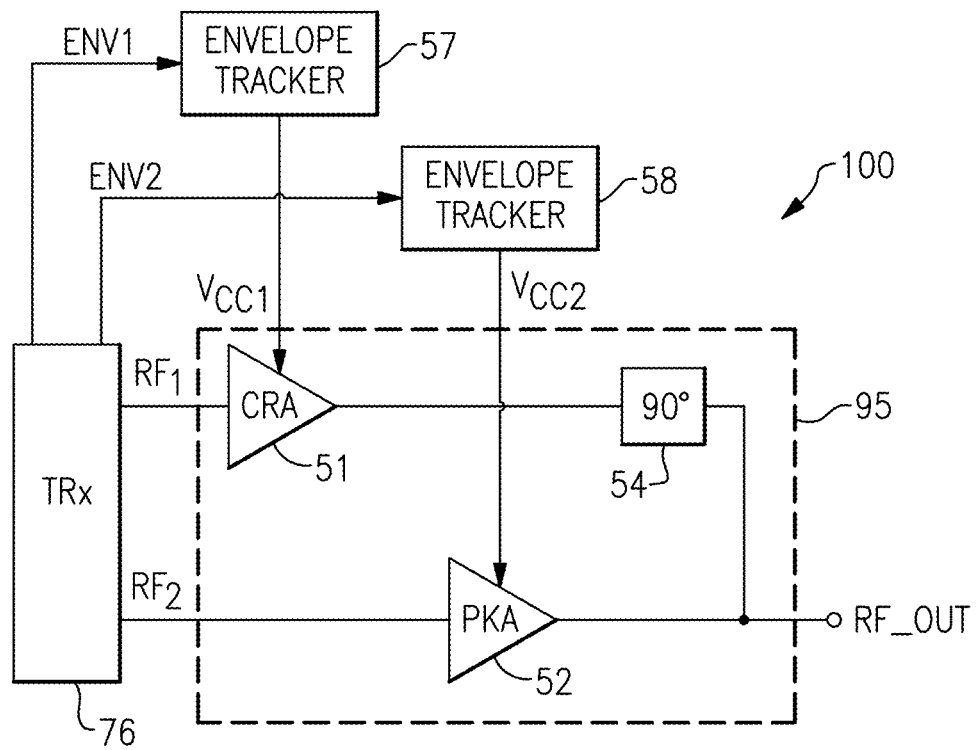
FIG. 7 is a schematic diagram of another embodiment of an envelope tracking system for a Doherty power amplifier.

FIG. 7 is a schematic diagram of another embodiment of an envelope tracking system 100 for a Doherty power amplifier 95.

The envelope tracking system 100 of FIG. 7 includes a first envelope tracker 57 for processing a first envelope signal ENV1 to generate a first supply voltage $V_{CC1}$ of the carrier amplification stage 51, and a second envelope tracker 58 for processing a second envelope signal ENV2 to generate a second supply voltage $V_{CC2}$ of the peaking amplification stage 52.

As shown in FIG. 7, a transceiver 76 provides the first envelope signal ENV1 to the first envelope tracker 57, and provides the second envelope signal ENV2 to the second envelope tracker 58. Additionally, the transceiver 76 provides the first RF input signal $RF_1$ to the carrier amplification stage 51 of the Doherty power amplifier 95 and provides the second RF input signal $RF_2$ to the peaking amplification stage 52 of the Doherty power amplifier 95. Thus, the Doherty power amplifier 95 omits circuitry for splitting and phase shifting the RF input signal, in this example.

The envelope tracking system 100 provides a number of advantages, including enhanced adjustability for amplitude/phase delay alignment. Furthermore, the envelope tracking system 100 operates with enhanced flexibility for providing DPD. For instance, separate amounts of DPD can be provided to the first RF input signal $RF_1$ relative to the second RF input signal $RF_2$.

Figure 8:
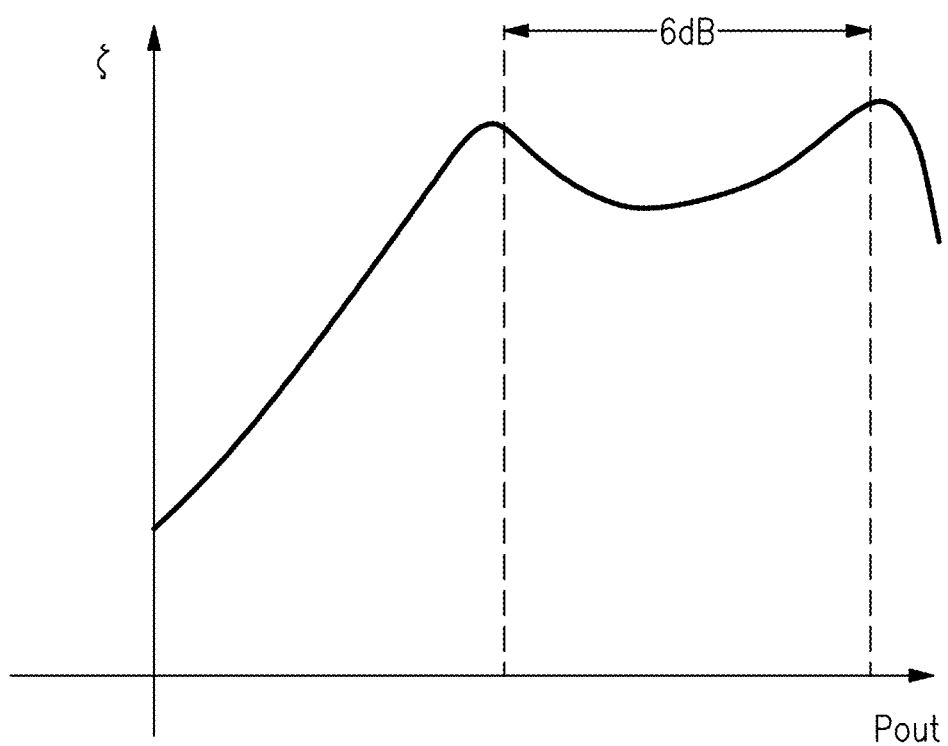
FIG. 8 is a graph of one example of efficiency versus output power for a Doherty power amplifier.

FIG. 8 is a graph of one example of efficiency versus output power for a Doherty power amplifier.

As shown in FIG. 8, the Doherty power amplifier can provide excellent efficiency at 6 dB power back-off, while also providing high efficiency over a wide range of power levels near maximum rated output power for a fixed supply.

Since the Doherty power amplifier operates efficiently over a range of power levels near maximum rated output power, a bandwidth constraint of an envelope tracker that modulates the supply voltage of the Doherty power amplifier is relaxed. Thus, gains can be achieved even when the envelope tracker has a relatively low amplitude modulation bandwidth. Furthermore, the envelope tracker can be implemented to efficiently modulate the supply voltage of the Doherty power amplifier to maintain the amplifier near peak backed off efficiency, thereby achieving further performance gain. Thus, inefficient operation of the Doherty power amplifier at power levels well below 6 dB power back-off can be avoided, thereby enhancing overall efficiency even when amplifying 5G waveforms with high PAPR.

Figure 9:
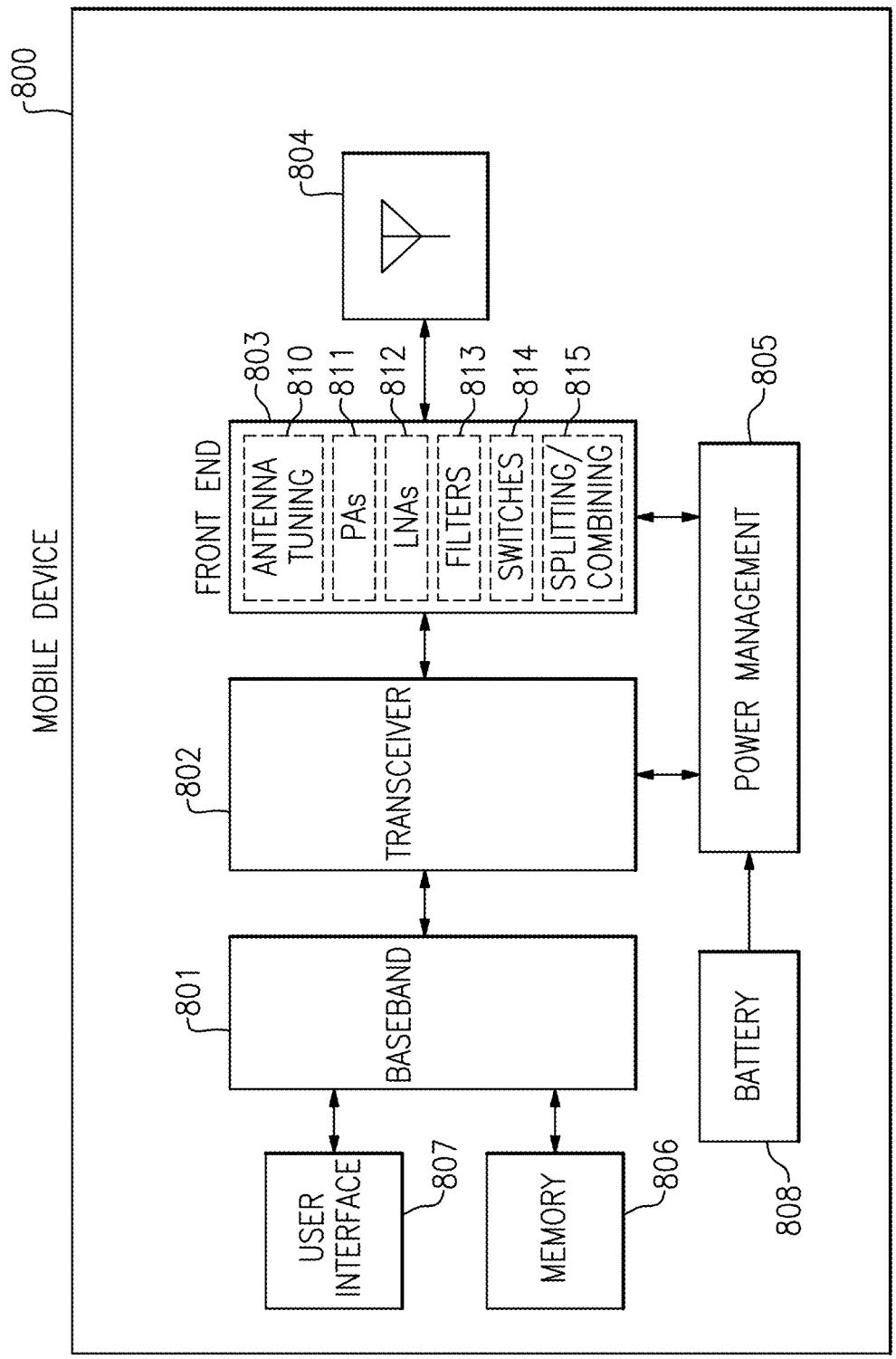
FIG. 9 is a schematic diagram of one embodiment of a mobile device.

FIG. 9 is a schematic diagram of one embodiment of a mobile device 800. The mobile device 800 includes a baseband system 801, a transceiver 802, a front end system 803, antennas 804, a power management system 805, a memory 806, a user interface 807, and a battery 808. The mobile device 800 can be implemented in accordance with any of the embodiment herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811 (which include one or more Doherty power amplifiers implemented in accordance with the teachings herein), low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Figure 10:
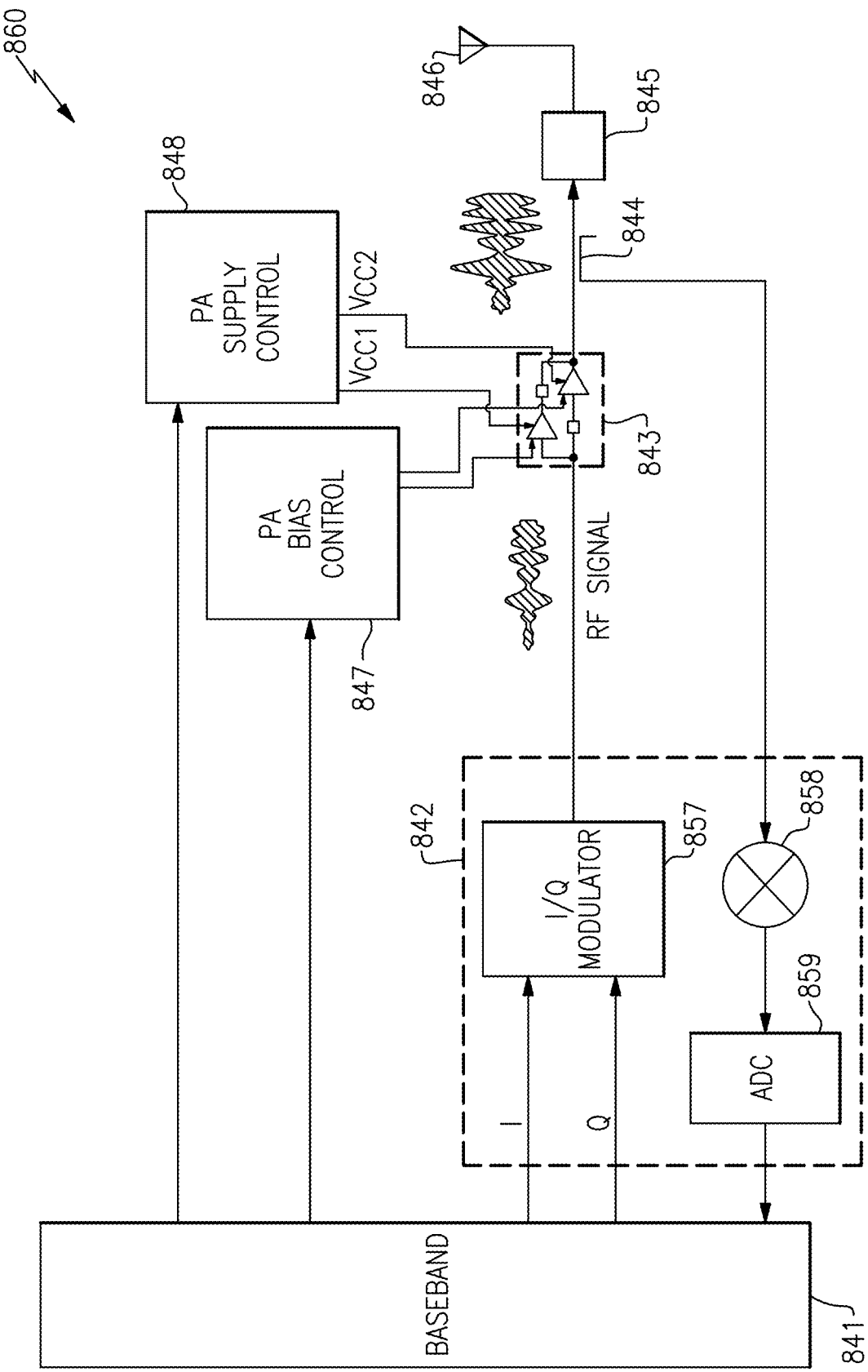
FIG. 10 is a schematic diagram of one embodiment of a communication system for transmitting RF signals.

FIG. 10 is a schematic diagram of one embodiment of a communication system 860 for transmitting RF signals. The illustrated communication system 860 includes a baseband processor 841, a transmitter/observation receiver 842, a Doherty power amplifier 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 821 can be included in the communication system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the Doherty power amplifier 843. In certain implementations, the I/Q modulator 857 can include one or more filters configured to filter frequency content of signals processed therein.

The Doherty power amplifier 843 can receive the RF signal from the I/Q modulator 857, and when enabled can provide an amplified RF signal to the antenna 846 via the front-end circuitry 845. Although one embodiment of a Doherty power amplifier is shown, the communication system 860 can be adapted to include any of the Doherty power amplifiers and envelope tracking systems herein.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the Doherty power amplifier 843 providing the amplified RF signal directly to the antenna 846.

The directional coupler 844 senses an output signal of the Doherty power amplifier 843. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the Doherty power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the Doherty power amplifier 843. In the illustrated configuration, the PA supply control circuit 848 generates a first supply voltage $V_{CC1}$ for powering a carrier amplification stage of the Doherty power amplifier 843 and a second supply voltage $V_{CC2}$ for powering a peaking amplification stage of the Doherty power amplifier 843. The PA supply control circuit 848 can control the voltage level of the first supply voltage $V_{CC1}$ and/or the second supply voltage $V_{CC2}$ to enhance PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 10, the PA bias control circuit 847 receives a bias control signal from the baseband processor 841, and generates bias control signals for the Doherty power amplifier 843. In the illustrated configuration, the bias control circuit 847 generates bias control signals for both the carrier amplification stage of the Doherty power amplifier 843 and the peaking amplification stage of the Doherty power amplifier 843. However, other implementations are possible.

Figure 11:
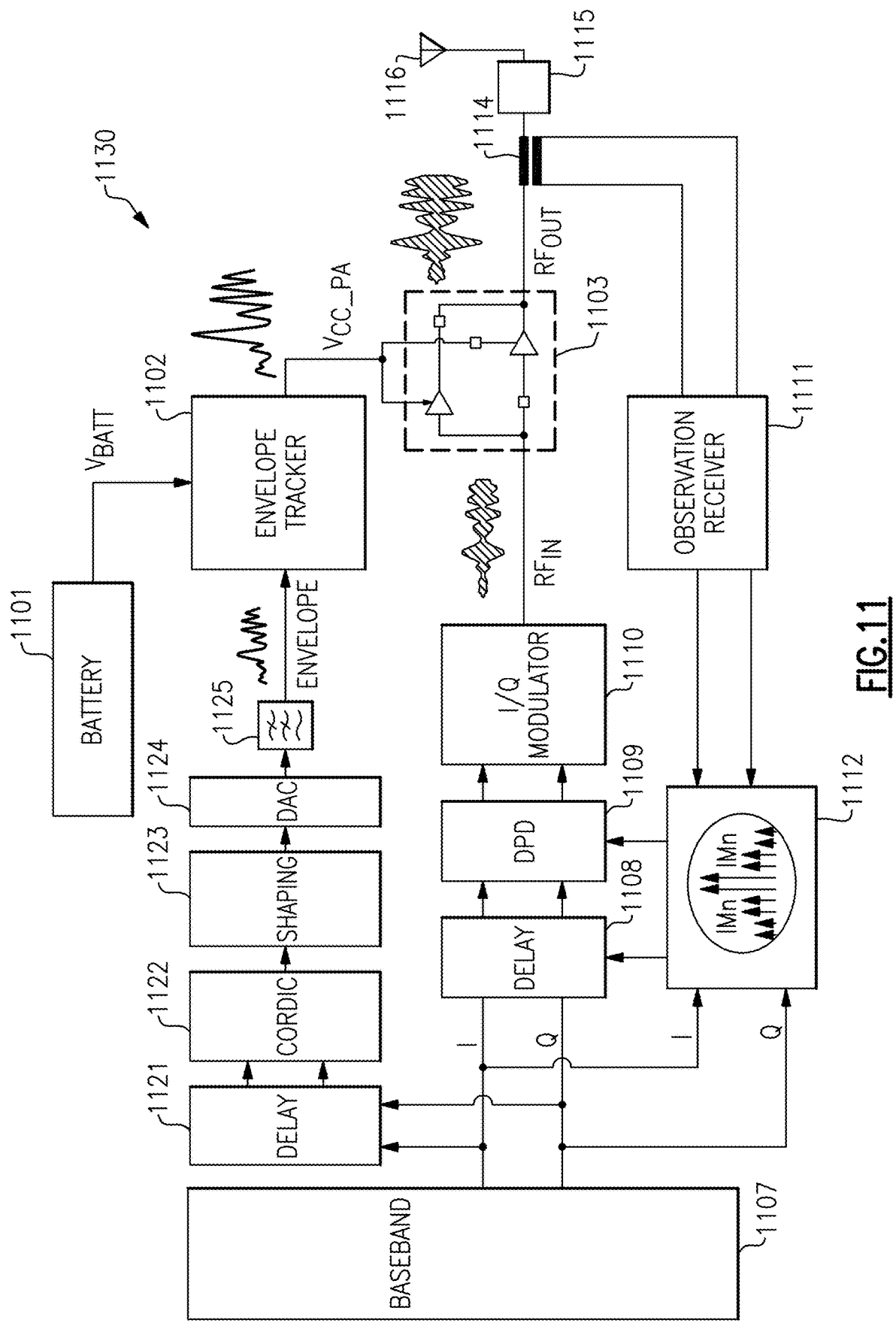
FIG. 11 is a schematic diagram of another embodiment of a communication system for transmitting RF signals.

FIG. 11 is a schematic diagram of one embodiment of a communication system 1130 for transmitting RF signals. The communication system 1130 includes a battery 1101, an envelope tracker 1102, a Doherty power amplifier 1103, a baseband processor 1107, a signal delay circuit 1108, a digital pre-distortion (DPD) circuit 1109, an I/Q modulator 1110, an observation receiver 1111, an intermodulation detection circuit 1112, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the Doherty power amplifier 1103 and/or to increase the efficiency of the Doherty power amplifier 1103.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the Doherty power amplifier 1103. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the Doherty power amplifier 1103.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 11, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the Doherty power amplifier 1103 that changes in relation to the envelope of the RF signal $RF_{IN}$. The Doherty power amplifier 1103 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the Doherty power amplifier 1103 and the input of the duplexing and switching circuit 1115, thereby allowing a measurement of output power of the Doherty power amplifier 1103 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $RF_{IN}$. In certain implementations, the intermodulation detection circuit 1112 also serves to control shaping provided by the shaping circuit 1123.

By including a feedback path from the output of the Doherty power amplifier 1103 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although one embodiment of a Doherty power amplifier is shown in FIG. 11, the communication system 1130 can be adapted to operate with any of the Doherty power amplifiers herein.

Figure 12:
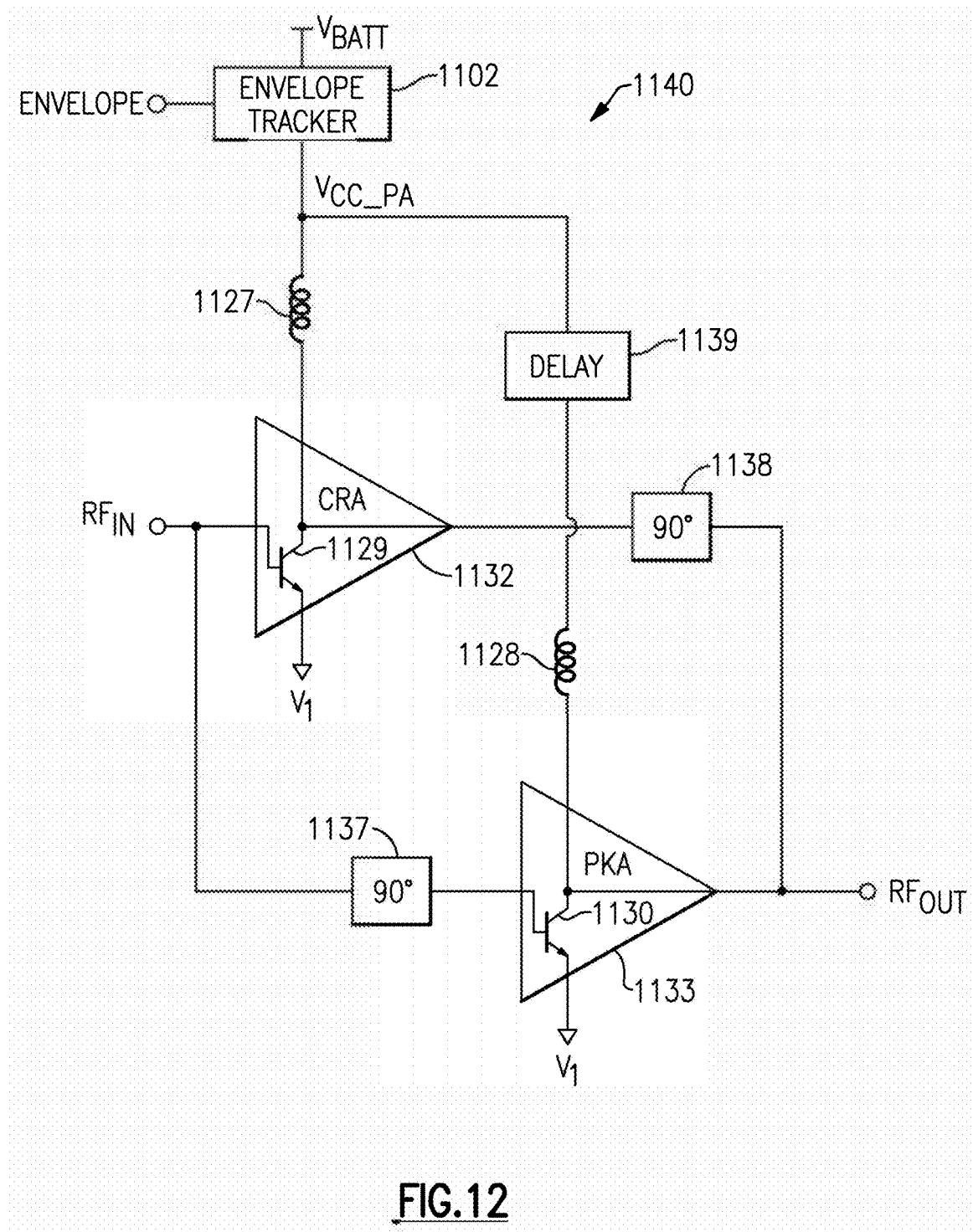
FIG. 12 is a schematic diagram of another embodiment of an envelope tracking system.

FIG. 12 is a schematic diagram of another embodiment of an envelope tracking system 1140. The illustrated envelope tracking system 1140 includes an envelope tracker 1102, a first inductor 1127, a second inductor 1128, a carrier amplification stage 1132, a peaking amplification stage 1133, an input phase shifter 1137, an output phase shifter 1138, and a delay circuit 1139.

As shown in FIG. 12, the envelope tracker 1102 receives a battery voltage $V_{BATT}$ and an envelope of the RF signal and generates a power amplifier supply voltage $V_{CC\_PA}$ that is provided to the carrier amplification stage 1132 through the first inductor 1127 and to the peaking amplification stage 1133 through the delay circuit 1139 and the second inductor 1128. Although FIG. 12 illustrates an embodiment in which the envelope tracker 1102 generates the power amplifier supply voltage $V_{CC\_PA}$ for both carrier amplification stage 1132 and the peaking amplification stage 1133, in another embodiment the envelope tracker 1102 includes a first envelope tracking circuit for generating a first power amplifier supply voltage for the carrier amplification stage and a second envelope tracking circuit for generating a second power amplifier supply voltage for the peaking amplification stage.

The illustrated carrier amplification stage 1132 includes a bipolar transistor 1129 having an emitter, a base, and a collector. As shown in FIG. 12, the emitter of the bipolar transistor 1129 is electrically connected to a power low supply voltage $V_1$, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The first inductor 1127 can be included to provide the carrier amplification stage 1132 with the power amplifier supply voltage $V_{CC\_PA}$ generated by the envelope tracker 1102 while choking or blocking high frequency RF signal components.

As shown in FIG. 12, the peaking amplification stage 1133 includes the bipolar transistor 1130. Additionally, the emitter of the bipolar transistor 1130 is electrically connected to the power low supply voltage $V_1$, and the RF signal ($RF_{IN}$) is provided to the base of the bipolar transistor 1130 after being delayed by the input phase shifter 1137. The bipolar transistor 1130 amplifies the RF signal to generate an amplified RF signal at the collector. The amplified RF signal from the bipolar transistor 1129 is delayed by the output phase shifter 1138, and combined with the amplified RF signal from the bipolar transistor 1130 to generate the RF output signal ($RF_{OUT}$).

Although FIG. 12 illustrates one implementation of a Doherty power amplifier, skilled artisans will appreciate that the teachings described herein can be applied to a variety of Doherty power amplifier structures, including Doherty power amplifiers employing other transistor structures. For example, in some implementations the bipolar transistors can be omitted in favor of employing field-effect transistors (FETs), such as silicon FETs, gallium arsenide (GaAs) high electron mobility transistors (HEMTs), or laterally diffused metal oxide semiconductor (LDMOS) transistors. Additionally, the Doherty power amplifier can be adapted to include additional circuitry, such as biasing circuitry.

Figure 13A:
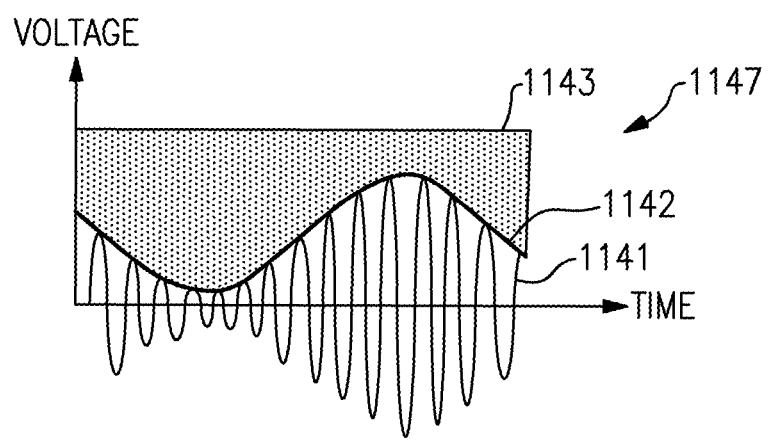
FIG. 13A shows a first example of a power amplifier supply voltage versus time.
Figure 13B:
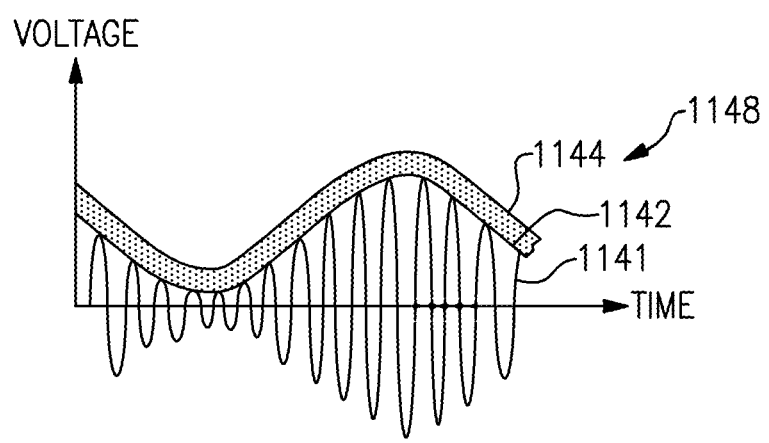
FIG. 13B shows a second example of a power amplifier supply voltage versus time.

FIGS. 13A and 13B show two examples of power amplifier supply voltage versus time.

In FIG. 13A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142. However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 13B, a graph 1148 illustrates another example of the voltage of an RF signal 1141 and a power amplifier supply voltage 1144 versus time. In contrast to the power amplifier supply voltage 1143 of FIG. 13A, the power amplifier supply voltage 1144 of FIG. 13B changes in relation to the envelope 1142 of the RF signal 1141. The area between the power amplifier supply voltage 1144 and the envelope 1142 in FIG. 13B is less than the area between the power amplifier supply voltage 1143 and the envelope 1142 in FIG. 13A, and thus the graph 1148 of FIG. 13B can be associated with a power amplifier operating with greater energy efficiency.

Figure 14A:
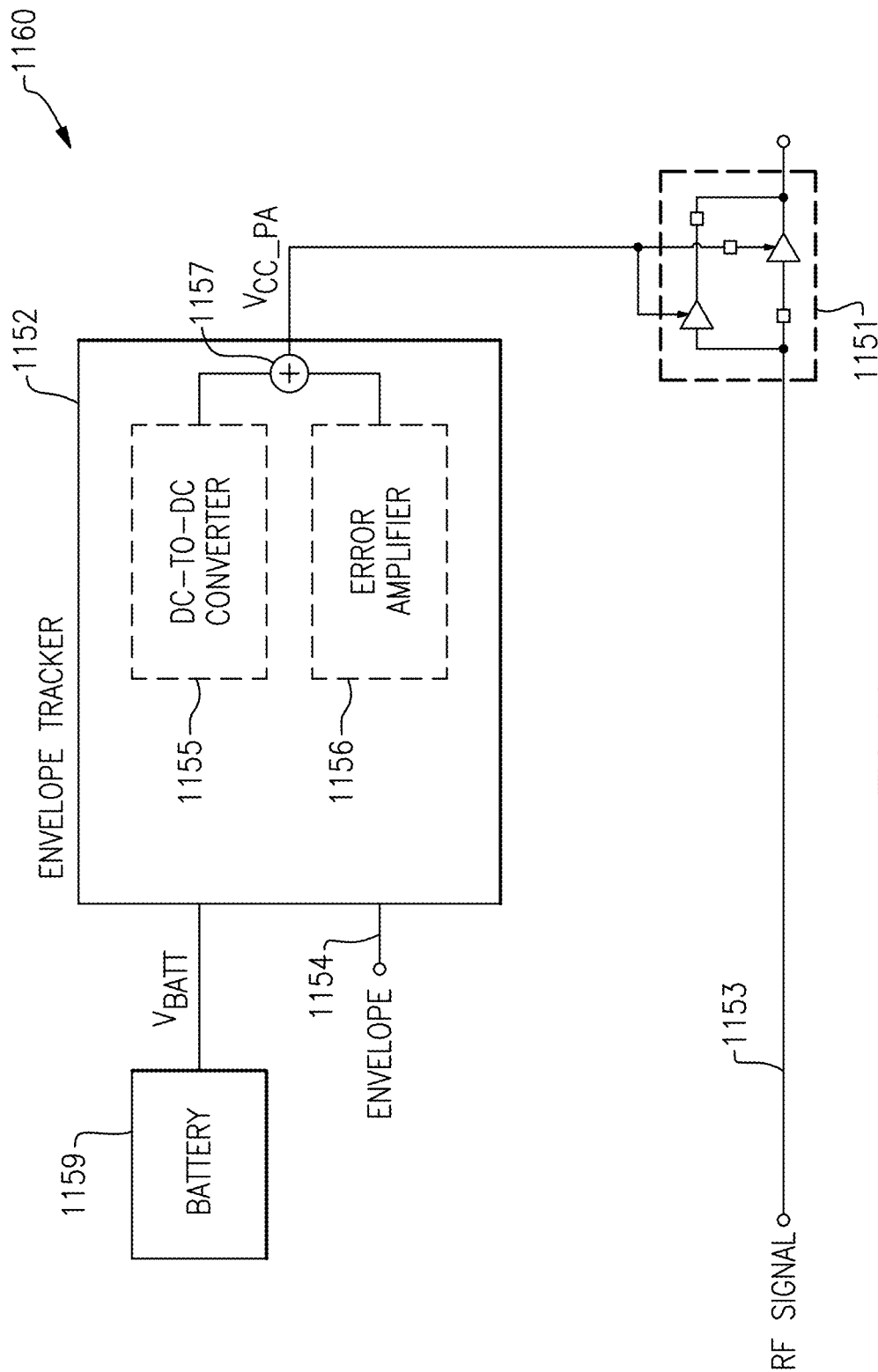
FIG. 14A is a schematic diagram of an envelope tracking system according to another embodiment.

FIG. 14A is a schematic diagram of an envelope tracking system 1160 according to another embodiment. The envelope tracking system 1160 includes a Doherty power amplifier 1151, an envelope tracker 1152, and a battery 1159. The Doherty power amplifier 1151 provides amplification to a radio frequency signal 1153.

The envelope tracker 1152 receives a battery voltage $V_{BATT}$ from the battery 1159 and an envelope signal 1154 corresponding to an envelope of the radio frequency signal 1153. Additionally, the envelope tracker 1152 generates a power amplifier supply voltage $V_{CC\_PA}$, which supplies power to the Doherty power amplifier 1151.

Although one embodiment of a Doherty power amplifier is shown, the envelope tracking system 1160 can be adapted in accordance with any of the envelope tracking schemes for Doherty power amplifiers disclosed herein.

As shown in FIG. 14A, the envelope tracker 1152 includes a DC-to-DC converter 1155 and an error amplifier 1156 that operate in combination with one another to generate the power amplifier supply voltage $V_{CC\_PA}$ based on the envelope signal 1154. Additionally, an output of the DC-to-DC converter 1155 and an output of the error amplifier 1156 are combined using a combiner 1157.

In the illustrated embodiment, the DC-to-DC converter 1155 and the error amplifier 1156 operate in parallel with one another to control the voltage level of the power amplifier supply voltage $V_{CC\_PA}$. The combination of the DC-to-DC converter 1155 and the error amplifier 1156 provides effective tracking of the envelope signal 1154, since the DC-to-DC converter 1155 provides superior tracking of low frequency components of the envelope signal 1154 while the error amplifier 1156 provide superior tracking of high frequency components of the envelope signal 1154.

Figure 14B:
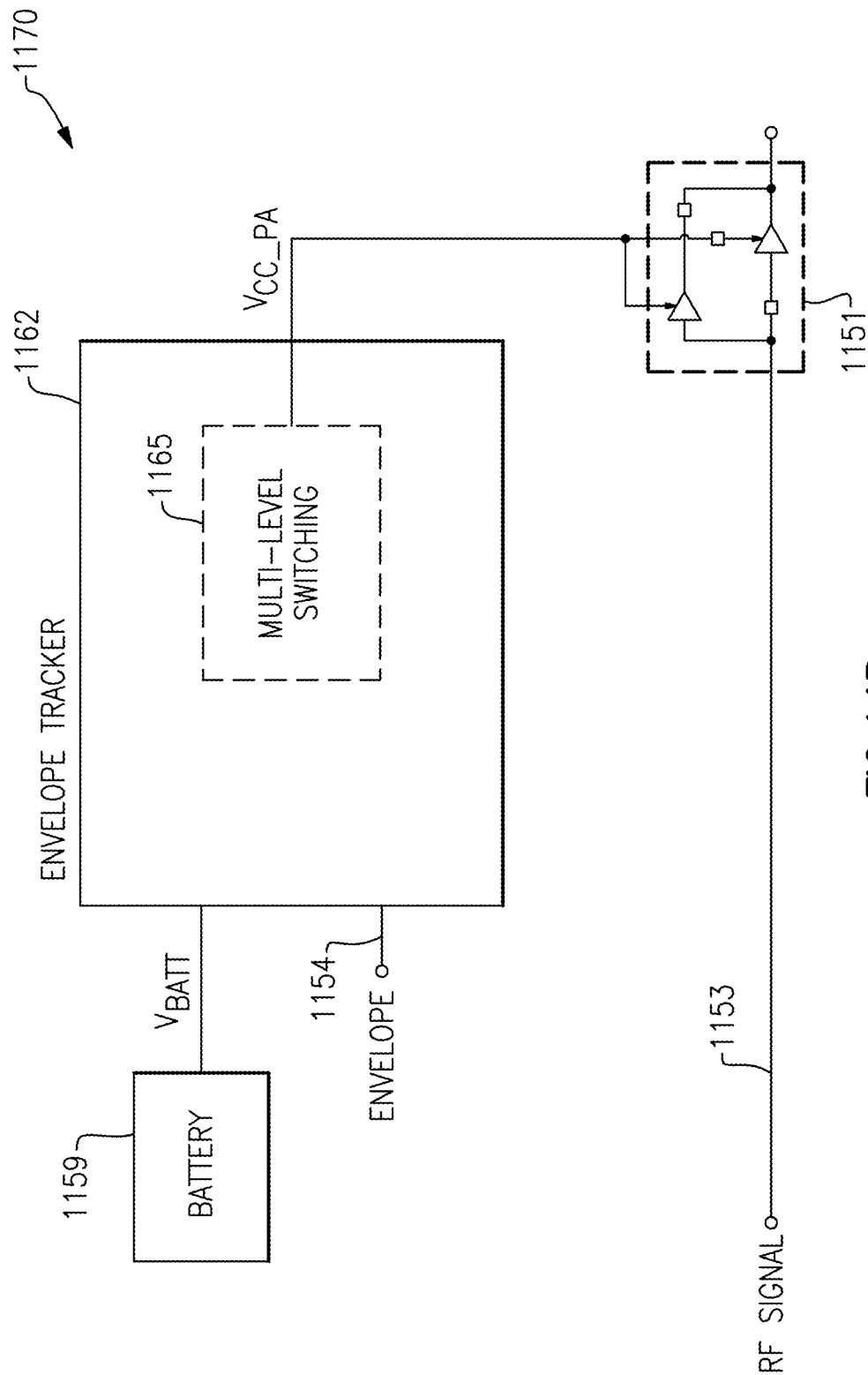
FIG. 14B is a schematic diagram of an envelope tracking system according to another embodiment.

FIG. 14B is a schematic diagram of an envelope tracking system 1170 according to another embodiment. The envelope tracking system 1170 includes a Doherty power amplifier 1151, a battery 1159, and an envelope tracker 1162. The Doherty power amplifier 1151 provides amplification to a radio frequency signal 1153.

Although one embodiment of a Doherty power amplifier is shown, the envelope tracking system 1170 can be adapted in accordance with any of the envelope tracking schemes for Doherty power amplifiers disclosed herein.

The envelope tracker 1162 of FIG. 14B illustrates another embodiment of an envelope tracker. However, the teachings herein are applicable to envelope trackers implemented in a wide variety of ways. Accordingly, other implementations are possible.

As shown in FIG. 14B, the envelope tracker 1162 receives a battery voltage $V_{BATT}$ from the battery 1159 and an envelope signal 1154 corresponding to an envelope of the radio frequency signal 1153. Additionally, the envelope tracker 1162 generates a power amplifier supply voltage $V_{CC\_PA}$, which supplies power to the Doherty power amplifier 1151.

The illustrated envelope tracker 1162 includes a multi-level switching circuit 1165. In certain implementations, the multi-level switching circuit 1165 includes a multi-output DC-to-DC converter for generating regulated voltages of different voltage levels, switches for controlling selection of a suitable regulated voltage over time based on the envelope signal 1154, and a filter for filtering the output of the switches to generate the power amplifier supply voltage $V_{CC\_PA}$.

Figure 15:
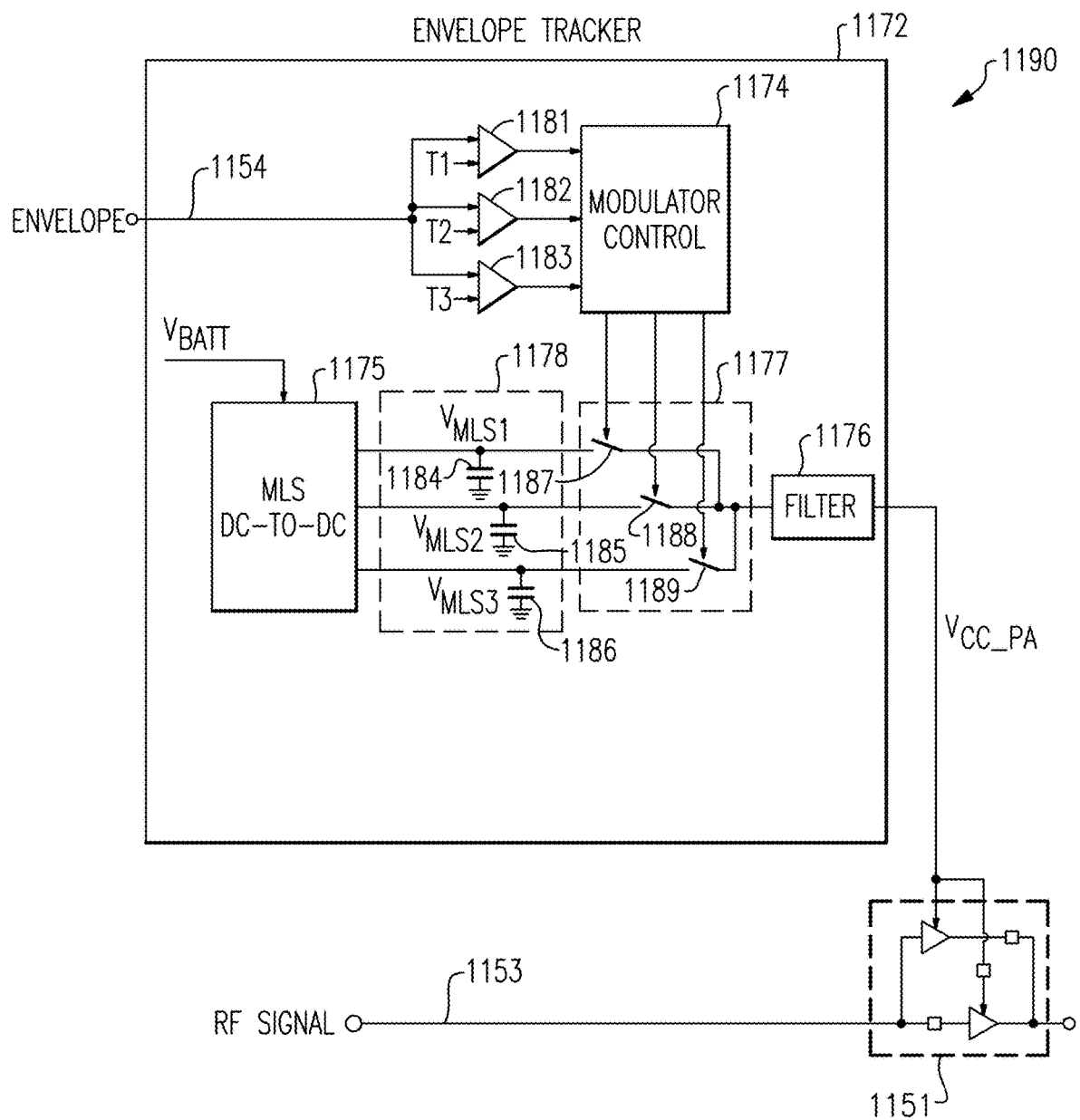
FIG. 15 is a schematic diagram of an envelope tracking system according to another embodiment.

FIG. 15 is a schematic diagram of an envelope tracking system 1190 according to another embodiment.

Although one embodiment of a Doherty power amplifier is shown, the envelope tracking system 1190 can be adapted in accordance with any of the envelope tracking schemes for Doherty power amplifiers disclosed herein.

The envelope tracking system 1190 includes a Doherty power amplifier 1151 and an envelope tracker 1172. The Doherty power amplifier 1151 provides amplification to a radio frequency signal 1153. As shown in FIG. 15, the envelope tracker 1172 receives an envelope signal 1154 corresponding to an envelope of the radio frequency signal 1153. Additionally, the envelope tracker 1172 generates a power amplifier supply voltage $V_{CC\_PA}$, which supplies power to the Doherty power amplifier 1151.

In the illustrated embodiment, the envelope tracker 1172 includes a modulator control circuit 1174, a multi-level supply (MLS) DC-to-DC converter 1175, a modulator output filter 1176, a modulator switch bank 1177, a decoupling capacitor bank 1178, a first comparator 1181, a second comparator 1182, and a third comparator 1183. The decoupling capacitor bank 1178 includes a first capacitor 1184, a second capacitor 1185, and a third capacitor 1186. Additionally, the modulator switch bank 1177 includes a first switch 1187, a second switch 1188, and a third switch 1189.

The envelope tracker 1172 of FIG. 15 illustrates another embodiment of an envelope tracker. However, the teachings herein are applicable to envelope trackers implemented in a wide variety of ways. Accordingly, other implementations are possible.

In the illustrated embodiment, the MLS DC-to-DC converter 1175 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. While illustrated as outputting three regulated voltages, the MLS DC-to-DC converter 1175 can generate more or fewer regulated voltages. In certain implementations, one or more of the regulated voltages are boosted voltages having a voltage level greater than the voltage level of the battery voltage $V_{BATT}$.

The decoupling capacitor bank 1178 stabilizes the regulated voltages generated by the MLS DC-to-DC converter 1175. For example, the first decoupling capacitor 1184 provides decoupling to the first regulated voltage $V_{MLS1}$, the second decoupling capacitor 1185 provides decoupling for second regulated voltage $V_{MLS2}$, and the third decoupling capacitor 1186 provides decoupling for the third regulated voltage $V_{MLS3}$. Although three decoupling capacitors are shown, more or fewer decoupling capacitors can be included.

The first to third comparators 1181-1183 compare the amplified envelope signal to a first threshold T1, a second threshold T2, and a third threshold T3, respectively. The results of the comparisons are provided to the modulator control circuit 1174, which processes the comparisons to select particular switches of the modulator switch bank 1177. In certain implementations, the modulator control circuit 1174 provides at least one of coding or dithering when controlling the modulator switch bank 1177 to compensate for artifacts arising from opening and closing the switches. Although an example with three comparators is shown, more or fewer comparators can be used.

The filter 1176 filters the output of the modulator switch bank 1177 to generate the power amplifier supply voltage $V_{CC\_PA}$. By controlling the selection of the switches 1187-1189 over time based on the envelope signal 1154, the envelope tracker 1172 controls the voltage level of the power amplifier supply voltage $V_{CC\_PA}$ to track the envelope signal 1154.

Figure 16A:
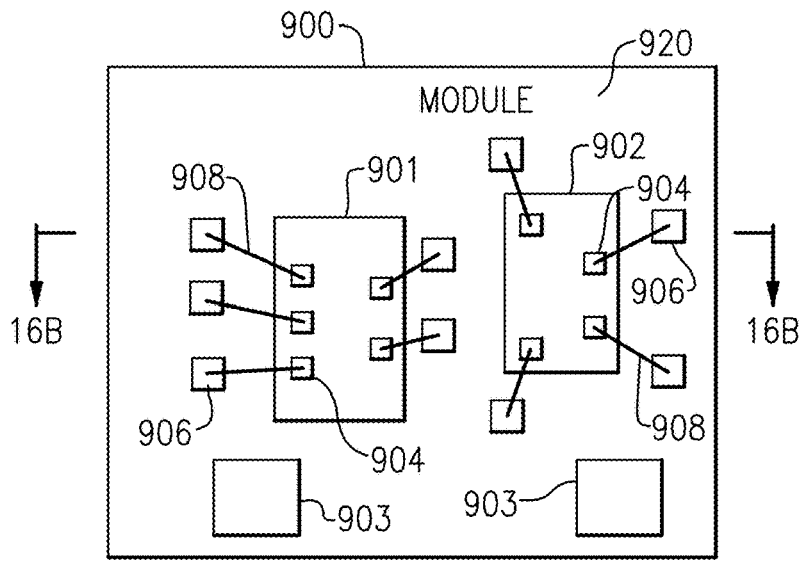
FIG. 16A is a schematic diagram of one embodiment of a packaged module.
Figure 16B:
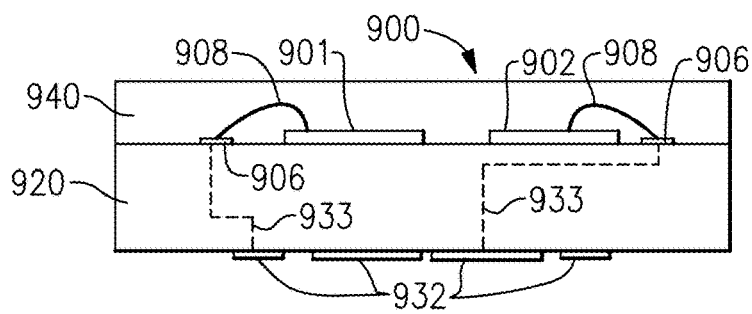
FIG. 16B is a schematic diagram of a cross-section of the packaged module of FIG. 16A taken along the lines 16B-16B.

FIG. 16A is a schematic diagram of one embodiment of a packaged module 900. FIG. 16B is a schematic diagram of a cross-section of the packaged module 900 of FIG. 16A taken along the lines 16B-16B. The packaged module 900 can be implemented in accordance with any of the embodiment herein.

The packaged module 900 illustrates an example of a module that can include circuitry implemented in accordance with one or more features of the present disclosure.

The packaged module 900 includes a first die 901, a second die 902, surface mount components 903, wirebonds 908, a package substrate 920, and encapsulation structure 940. The package substrate 920 includes pads 906 formed from conductors disposed therein. Additionally, the dies 901, 902 include pads 904, and the wirebonds 908 have been used to connect the pads 904 of the dies 901, 902 to the pads 906 of the package substrate 920.

In certain implementations, the dies 901, 902 are manufactured using different processing technologies. In one example, the first die 901 is manufactured using a compound semiconductor process, and the second die 902 is manufactured using a silicon process. Although an example with two dies is shown, a packaged module can include more or fewer dies.

The packaging substrate 920 can be configured to receive a plurality of components such as the dies 901, 902 and the surface mount components 903, which can include, for example, surface mount capacitors and/or inductors.

As shown in FIG. 16B, the packaged module 900 is shown to include a plurality of contact pads 932 disposed on the side of the packaged module 900 opposite the side used to mount the dies 901, 902. Configuring the packaged module 900 in this manner can aid in connecting the packaged module 900 to a circuit board such as a phone board of a wireless device. The example contact pads 932 can be configured to provide RF signals, bias signals, ground, and/or supply voltages to the dies 901, 902 and/or the surface mount components 903. As shown in FIG. 16B, the electrically connections between the contact pads 932 and the dies 901, 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling of the packaged module 900. Such a packaging structure can include overmold or encapsulation structure 940 formed over the packaging substrate 920 and the surface mount component(s) and die(s) disposed thereon.

It will be understood that although the packaged module 900 is described in the context of electrical connections based on wirebonds, one or more features of the present disclosure can also be implemented in other packaging configurations, including, for example, flip-chip configurations.

Figure 16C:
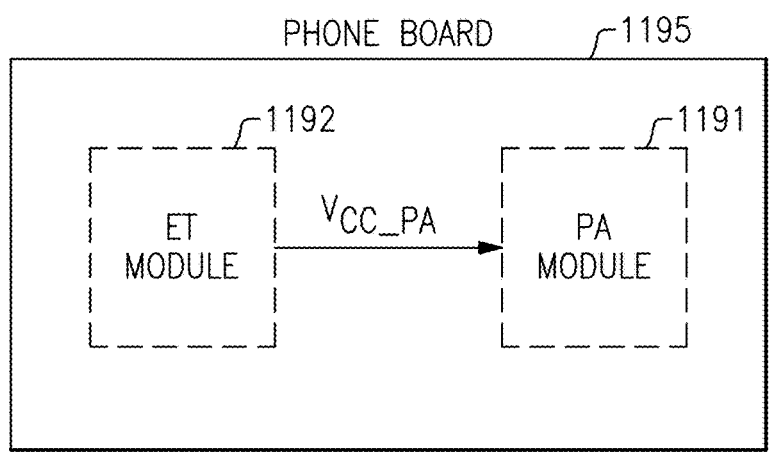
FIG. 16C is a schematic diagram of one embodiment of a phone board.

FIG. 16C is a schematic diagram of one embodiment of a phone board 1195. The phone board 1195 includes an envelope tracking module 1192 and a power amplifier module 1191 attached thereto. The phone board 1195 can be implemented in accordance with any of the embodiment herein.

In certain configurations, the power amplifier module 1191 and/or the envelope tracking module 1192 are implemented using a module similar to that of the module 900 shown in FIGS. 16A-16B. As shown in FIG. 16C, the envelope tracking module 1192 provides a power amplifier supply voltage $V_{CC\_PA}$ to the power amplifier module 1191. Additionally, the envelope tracking module 1192 controls the power amplifier supply voltage $V_{CC\_PA}$ to change in relation to the envelope of an RF signal amplified by the power amplifier module 1191.

Although not illustrated in FIG. 16C for clarity, the phone board 1195 typically includes additional components and structures.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a first radio frequency signal;
a front end system including a Doherty power amplifier configured to amplify the first radio frequency signal, the Doherty power amplifier including a carrier amplification stage, a peaking amplification stage, and a delay circuit configured to delay a first supply voltage to the carrier amplification stage to generate a second supply voltage to the peaking amplification stage; and
a power management system including an envelope tracker configured to control at least one supply voltage of the Doherty power amplifier based on a first envelope signal indicating an envelope of the first radio frequency signal, the at least one supply voltage including the first supply voltage to the carrier amplification stage and the second supply voltage to the peaking amplification stage.

2. The mobile device of claim 1 wherein the delay circuit is operable to compensate for a phase delay mismatch between the carrier amplification stage and the peaking amplification stage.

3. The mobile device of claim 1 wherein the transceiver generates the first envelope signal.

4. The mobile device of claim 1 wherein the carrier amplification stage is configured to receive the first radio frequency signal from the transceiver and the peaking amplification stage is configured to receive a second radio frequency signal from the transceiver.

5. The mobile device of claim 1 wherein the carrier amplification stage is configured to receive the first radio frequency signal, the Doherty power amplifier further including an input phase shifter configured to generate a second radio frequency signal based on phase shifting the first radio frequency signal, the peaking amplification stage configured to receive the second radio frequency signal.

6. The mobile device of claim 5 wherein the phase shift provided by the input phase shifter is about ninety degrees.

7. A method of radio frequency amplification in a mobile device, the method comprising:
generating a first radio frequency signal using a transceiver;
amplifying the first radio frequency signal to generate an amplified radio frequency signal using a Doherty power amplifier that includes a carrier amplification stage and a peaking amplification stage; and
controlling at least one supply voltage of the Doherty power amplifier based on an envelope signal using an envelope tracker, the envelope signal indicating an envelope of the first radio frequency signal, controlling the at least one supply voltage of the Doherty power amplifier including powering the carrier amplification stage with a first supply voltage, powering the peaking amplification stage with a second supply voltage, and delaying the first supply voltage to generate the second supply voltage.

8. The method of claim 7 wherein delaying the first supply voltage to generate the second supply voltage includes compensating for a phase delay mismatch between the carrier amplification stage and the peaking amplification stage.

9. The method of claim 7 further comprising combining a first output signal from the carrier amplification stage and a second output signal from the peaking amplification stage to generate an amplified radio frequency signal.

10. The method of claim 9 further comprising wirelessly transmitting the amplified radio frequency signal using an antenna.

11. The method of claim 7 further comprising providing the first radio frequency signal from the transceiver to the carrier amplification stage of the Doherty power amplifier, and providing a second radio frequency signal from the transceiver to the peaking amplification stage of the Doherty power amplifier.

12. The method of claim 7 further comprising providing the first radio frequency signal to the carrier amplification stage of the Doherty power amplifier, delaying the first radio frequency signal to generate a second radio frequency signal, and providing the second radio frequency signal to the peaking amplification stage of the Doherty power amplifier.

13. The method of claim 12 further comprising wherein delaying the first radio frequency signal to generate the second radio frequency signal includes using an input phase shifter of the Doherty power amplifier to provide a phase shift.

14. The method of claim 13 wherein the phase shift is about ninety degrees.

15. The mobile device of claim 1 further comprising an antenna configured to wirelessly transmit an amplified radio frequency signal generated by the Doherty power amplifier.

16. An envelope tracking system comprising:
a Doherty power amplifier configured to amplify a radio frequency signal to generate an amplified radio frequency signal, the Doherty power amplifier including a carrier amplification stage, a peaking amplification stage, and a delay circuit configured to delay a first supply voltage to the carrier amplification stage to generate a second supply voltage to the peaking amplification stage; and
an envelope tracker configured to control at least one supply voltage of the Doherty power amplifier based on an envelope signal indicating an envelope of the radio frequency signal, the at least one supply voltage including the first supply voltage to the carrier amplification stage and the second supply voltage to the peaking amplification stage.

17. The envelope tracking system of claim 16 wherein the delay circuit is operable to compensate for a phase delay mismatch between the carrier amplification stage and the peaking amplification stage.

18. The envelope tracking system of claim 16 wherein the Doherty power amplifier further includes an input phase shifter configured to generate a phase-shifted radio frequency signal based on phase shifting the radio frequency signal, the carrier amplification stage configured to receive the radio frequency signal, and the peaking amplification stage configured to receive the phase-shifted radio frequency signal.

19. The envelope tracking system of claim 18 wherein a phase shift provided by the input phase shifter is about ninety degrees.

20. The envelope tracking system of claim 16 further comprising an antenna configured to wirelessly transmit an amplified radio frequency signal generated by the Doherty power amplifier.

\* \* \* \* \*